United States Patent
Wang et al.

(10) Patent No.: US 9,594,543 B2
(45) Date of Patent: Mar. 14, 2017

(54) ACTIVITY DIAGRAM MODEL-BASED SYSTEM BEHAVIOR SIMULATION METHOD

(71) Applicant: Nanjing University, Nanjing, Jiangsu (CN)

(72) Inventors: Linzhang Wang, Jiangsu (CN); Lei Yu, Jiangsu (CN); Lei Bu, Jiangsu (CN); Xuandong Li, Jiangsu (CN); Zhi Chen, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 0 days.

(21) Appl. No.: 14/442,653

(22) PCT Filed: Nov. 13, 2013

(86) PCT No.: PCT/CN2013/086991
§ 371 (c)(1),
(2) Date: May 13, 2015

(87) PCT Pub. No.: WO2014/180106
PCT Pub. Date: Nov. 13, 2014

(65) Prior Publication Data
US 2016/0283201 A1    Sep. 29, 2016

(30) Foreign Application Priority Data

May 8, 2013 (CN) .......................... 2013 1 0168258

(51) Int. Cl.
G06F 9/44 (2006.01)
(52) U.S. Cl.
CPC ..................................... G06F 8/35 (2013.01)
(58) Field of Classification Search
CPC ....................................................... G06F 8/35
(Continued)

(56) References Cited

U.S. PATENT DOCUMENTS 8,117,591 B1   2/2012 Michelsen
2005/0256665 A1* 11/2005 Hartmann ........... G06F 11/3688
702/121

(Continued)

FOREIGN PATENT DOCUMENTS

CN   101459914 A   6/2009
CN   101464797 A   6/2009

(Continued)

OTHER PUBLICATIONS

Chen et al., "Automatic Test Case Generation for UML Activity Diagrams," May 23, 2006, ACM, p. 2-8.*
Chen et al., "UML Activity Diagram-Based Automatic Test Case Generation for Java Programs," 2009, The Computer Journal, p. 545-556.*

(Continued)

Primary Examiner — Qing Chen
(74) Attorney, Agent, or Firm — Saliwanchik, Lloyd & Eisenschenk

(57) ABSTRACT

An activity diagram model-based system behavior simulation method. First, a to-be-simulated unified modeling language activity diagram model is read and parsed, and extracted therefrom is important model element information, and a complete model mapping is constructed in a memory; then, the unified modeling language activity diagram model that is read is parsed, and various model elements respectively are parsed from the unified modeling language activity diagram model; then, a hybrid execution concept is combined and employed for continued specific execution, symbolic execution, and constraint solving, and the process is terminated insofar that a node coverage threshold is reached; and finally, simulated use cases collected in the preceding step is used for simulated execution of the unified modeling language activity diagram model. This implements automatic generation of the simulated use cases used for simulated execution of the unified modeling language activity model, construction of a simulated execution envi- (Continued)

ronment for the unified modeling language activity diagram model, compilation of statistics on node coverage information of the simulated use cases of the unified modeling language activity diagram model, and feedback of a simulated execution result.

1 Claim, 1 Drawing Sheet

(58) Field of Classification Search
USPC .................................................. 717/104, 105
See application file for complete search history.

(56) References Cited

U.S. PATENT DOCUMENTS

| | | | | |
|---|---|---|---|---|
| 2006/0253839 | A1* | 11/2006 | Avritzer | G06F 11/3684 717/124 |
| 2007/0094542 | A1* | 4/2007 | Bartucca | G06F 11/3672 714/38.1 |
| 2007/0277151 | A1* | 11/2007 | Brunel | G06F 8/31 717/113 |
| 2009/0094575 | A1* | 4/2009 | Vieira | G06F 11/3684 717/104 |
| 2014/0130006 | A1* | 5/2014 | Son | G06F 11/3684 717/104 |

FOREIGN PATENT DOCUMENTS

| CN | 102799530 A | 11/2012 |
|---|---|---|
| CN | 103246770 A | 8/2013 |

OTHER PUBLICATIONS

Chen et al., "Efficient test case generation for validation of UML activity diagrams," Jun. 18, 2010, Springer Science+Business Media, LLC, p. 105-130.*
Cui et al., "Modeling and Integrating Aspects with UML Activity Diagrams," Mar. 2009, ACM, p. 430-437.*
Eshuis, Rik, "Symbolic Model Checking of UML Activity Diagrams," Jan. 2006, ACM, p. 1-38.*
Kaur et al., "Prioritization of Test Scenarios Derived from UML Activity Diagram Using Path Complexity," Sep. 2012, ACM, p. 355-359.*
Lei et al., "UML Activity Diagram Based Testing of Java Concurrent Programs for Data Race and Inconsistency," 2008, IEEE, p. 200-209.*
Li et al., "UML State Machine Diagram Driven Runtime Verification of Java Programs for Message Interaction Consistency," Mar. 2008, ACM, p. 384-389.*
Nayak et al., "Synthesis of test scenarios using UML activity diagrams," 2009, Springer-Verlag, p. 63-89.*
Samuel et al., "Slicing-Based Test Case Generation from UML Activity Diagrams," Nov. 2009, ACM, p. 1-14.*
Shirole et al., "Transition Sequence Exploration of UML Activity Diagram using Evolutionary Algorithm," Feb. 2012, ACM, p. 97-100.*
Swain et al., "Generation of Test Cases Using Activity Diagram," Jan. 2013, International Journal of Computer Science and Informatics, p. 1-10.*
Wang et al., "Generating Test Cases from UML Activity Diagram based on Gray-Box Method," 2004, IEEE, p. 1-8.*
Zhou et al., "Jasmine: A Tool for Model-Driven Runtime Verification with UML Behavioral Models," 2008, IEEE, p. 487-490.*

* cited by examiner

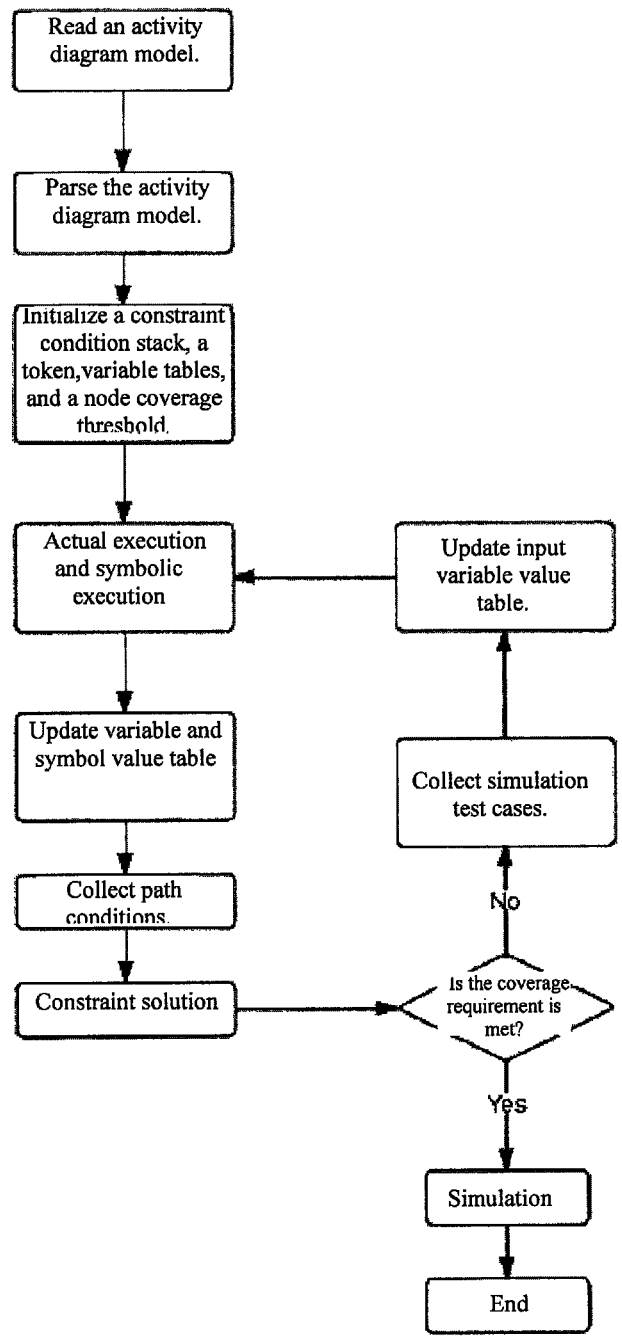

ACTIVITY DIAGRAM MODEL-BASED SYSTEM BEHAVIOR SIMULATION METHOD

CROSS REFERENCE TO A RELATED APPLICATION

This application is a National Stage Application of International Application Number PCT/CN2013/086991, filed Nov. 13, 2013; which claims priority to Chinese Patent Application No. 201310168258.8, filed May 8, 2013; both of which are incorporated herein by reference in their entirety.

TECHNICAL FIELD

The present invention relates to a system behavior simulation method based on UML (Unified Modeling Language) activity diagram model, which mainly employs an approach that incorporates symbolic execution and actual execution to solve the problem of generation of simulation test cases and thereby realize system behavior simulation. The present invention belongs to a cross technical field across software engineering, model driven engineering, and system simulation.

BACKGROUND ART

Simulating the software behaviors reflected by a model is an important means in the software testing field. Software testing and verification is the most fundamental and important means for ensuring software correctness and improving software reliability, as well as a mainstream approach employed in the industry. As the object oriented software development technique is applied widely and a demand for software testing automation emerges, model based software testing has received more and more attention gradually. Model based software testing belongs to the category of protocol based software testing, and is characterized in: both the test case generation and the test result evaluation are carried out on the basis of the model and derived model of the tested application program (usually referred to as test model). A software model is abstract description of software behaviors and software structure. Software behaviors can be described by system input sequence, activities, conditions, output logic or data flow.

Model based tests are a sort of automated tests, such tests are based on the model, in which a large number of test cases for a tested system are generated automatically as a group in one run. A model is an abstract that describes the behaviors of a tested system in an aspect. In a model based testing approach, firstly, modeling is carried out for a system according to the system requirement and functional specification; then, test cases are generated automatically on the basis of the model; finally, a verification process is executed. Model based testing can bring the following benefits: the schedule can be shortened, the cost can be reduced, the quality can be improved, a model of user behaviors can be obtained, the communication between the developer and the tester can be improved, ambiguous factors in the specification and design can be dug out as early as possible, tests can be generated and executed automatically, and changes to the testing kit incurred by requirement changes can be reduced.

A hybrid execution approach is an approach that incorporates symbolic execution and actual execution. Symbolic execution refers to substituting actual variables with symbolic variables and simulating program execution to carry out relevant analysis without actual program execution, and is usually used in conjunction with solution of a constraint satisfaction problem. Actual execution refers to inputting specific variable values into the program to drive normal execution of the program. A hybrid execution approach is a hybrid software program verification approach in which actual execution and symbolic execution are carried out in alternate way for a program.

CONTENTS OF THE INVENTION

Technical Problem

The Unified Modeling Language (UML) has become a de facto standard among modeling languages. However, the existing method for generating test cases from a UML activity diagram can not generate test cases fully and automatically and requires manual intervention to some degree. Consequently, simulation of a UML activity diagram can be carried out only in a semi-automatic manner. The object of the present invention is to provide a system behavior simulation method based on activity diagram model, which can solve the problems, such as coverage statistics and feedback of execution result, etc., during generation of simulation test cases for simulated execution, construction of an execution environment for model simulation, and execution of model simulation.

Technical Solution

In the present invention, firstly, a UML activity diagram model to be simulated is read and parsed, important model element information is extracted from the model, and complete model mapping is built up in the memory; then, the read-in UML activity diagram model is parsed and various model elements are parsed out from the UML activity diagram model; next, progressive actual execution, symbolic execution, and constraint solution are carried out for the model in a hybrid execution concept, till a node coverage threshold is reached; finally, simulated execution of the UML activity diagram model is carried out in the simulation test cases obtained in the previous step.

The system behavior simulation method based on activity diagram model comprises the following steps:
1) reading a UML activity diagram model stored in XMI (XML Metadata Interchange) format from a disk file;
2) parsing out various model elements including initial node, final node, decision node, merge node, fork node, join node, action node, activity node, transition edge, and decision condition, from the read-in UML activity diagram model, respectively, wherein, the transition edge is a directed edge for connecting the nodes and indicating a node hopping direction; the decision condition is a condition attached to a transition edge to control a token transition; the token is flag data that indicates an accessed node;
3) traversing the UML activity diagram model in a hybrid execution approach that incorporates symbolic execution and actual execution, and generating simulation test cases; the symbolic execution is to express variables as symbols for operating, a set of symbolic expressions of the input variables as the operation result, and accordingly update a symbol value table of the variables; whereas the actual execution is to substitute the variables with specific values and execute operations to obtain a set of specific values as the operation result, and accordingly update a specific value table of the variables;

31) initializing a constraint condition stack, a token, variable tables, a node coverage threshold, and a constraint solver, according to various model elements parsed from the UML activity diagram model; the constraint condition stack is a stack data structure configured to store constraint conditions; the token transition indicates a value change of token flag data, i.e., the accessed node changes; the variable tables include specific value table and symbol value table of variables; the node coverage is the ratio of the number of accessed nodes to the total number of nodes parsed from the UML activity diagram model, and the node coverage value is calculated and updated continuously according to the node access condition, while the node coverage threshold is preset; the constraint solver is configured to solve a set of constraint conditions to obtain specific variable values that meet the set of constraint conditions;

32) generating a set of input variable values randomly to enable the token to be transited in the direction of the transition edge, and treating different types of accessed nodes in different ways, respectively;

321) if the accessed node is an initial node, making no treatment and skipping the token in the direction of exit edge to the next activity node;

322) if the accessed node is an action node, adopting symbolic execution and actual execution respectively for the statements in the node according to the semantics represented by the node, and updating the input variable values and node coverage value;

323) if the accessed node is an activity node, entering into the UML activity diagram model associated to the node, and entering into step 1) to execute another UML activity diagram model simulation process;

324) if the accessed node is a decision node, selecting a token transition edge according to the decision condition on the exit edge of the node, and pushing the decision condition corresponding to the token transition edge into the constraint condition stack for subsequent use;

325) if the accessed node is a merge node, directly transiting the token into the next activity;

326) if the accessed node is a fork node, replicating the token into a specific number of copies determined according to the number of exit edges of the fork node, and transiting the tokens obtained by replication along the transition edge respectively;

327) if the accessed node is a join node, observing the condition of tokens transited to the nodes concurrent with the accessed node, and merging these tokens into one token and moving backward the resultant token in the direction of the transition edge if the tokens on all of the concurrent nodes are to be transited to the accessed node;

328) if the accessed node is a final node, reading all constraint conditions in the constraint condition stack, taking out the stack top constraint and negating it, and then inputting the negated stack top constraint together with other constraints in the stack into the constraint solver to solve the constraints; updating the input variable values and storing the set of input variable values as a set of simulation test cases if the constraint solution is successful; otherwise saving path conditions that can not be solved and corresponding traversing paths and having them confirmed manually by an operator, and at the same time, popping off the stack top element in the constraint condition stack, taking out the next constraint condition in the stack and negating it, and then inputting the negated constraint together with other constraints in the stack into the constraint solver to solve the constraints, and updating the input variable values;

329) calculating and updating the node coverage value according to the node access condition; returning the token to the initial node, transiting the token in the direction of the transition edge with the input variable values updated in step 328), and entering into step 321), if the node coverage value goes beyond the node coverage threshold; otherwise entering into step 4);

4) inputting the simulation test cases stored in the above steps, to carry out simulated execution of the UML activity diagram model.

Beneficial Effects

The system behavior simulation method based on UML activity diagram model mentioned in the present invention realizes automatic generation of simulation test cases for simulated execution of UML activity diagram model, construction of a simulated execution environment for UML activity diagram model, statistics of node coverage information of simulation test cases of UML activity diagram model, and feedback of a simulated execution result. Specifically, the method mentioned in the present invention has the following beneficial effects:

4. In the system behavior simulation method based on UML activity diagram model mentioned in the present invention, under a hybrid execution concept, automatic generation of simulation test cases for UML activity diagram model is realized. The generated test cases include specific input values, model execution sequences corresponding to the input values, and expected outputs. These test cases can serve for unit testing and integration testing after system implementation in the software development cycle. Thus, reuse of test cases is realized, the testing efficiency is improved, and the testing cost is reduced.

5. In the system behavior simulation method based on UML activity diagram model mentioned in the present invention, a simulated execution environment for UML activity diagram model is constructed, so that the activity diagram model can accept test cases generated automatically and be executed automatically in a simulated manner. When the simulated execution of the model is carried out, the coverage of the generated simulation test cases on the model can be acquired, and the execution result can be fed back in real time.

DESCRIPTION OF DRAWINGS

FIG. 1 is a flow chart of the system behavior simulation method based on UML activity diagram model.

EMBODIMENTS

Hereunder the present invention will be further detailed in some embodiments.

1. Read and Parse a UML Activity Diagram Model

Like most UML models, UML activity diagram models are also saved in XMI (XML Metadata Interchange) format. In actual practice, an XML parsing tool dom4j can be used. Due to the support of dom4j for visitor design pattern, all operations for treating different node types and node attributes can be reloaded for the access methods in dom4j by defining a user-defined class that implements a visitor interface. Hereunder the operations for different node types and attributes will be described:

(1) Initial node: read the initial node ID and instantiate the initial node.
(2) Action node: record the node ID, connect the entry edges and exit edges associated to the node, save the values of attributes of activity behaviors on the node, and instantiate the node.
(3) Activity node: record the node ID, connect the entry edges and exit edges associated to the node, save the values of attributes of the activity diagram associated to the node, and instantiate the node.
(4) Decision node: record the node ID, connect the entry edges and exit edges associated to the node, and instantiate the node.
(5) Merge node: record the node ID, connect the entry edges and exit edges associated to the node, and instantiate the node.
(6) Fork node: record the node ID, connect the entry edges and exit edges associated to the node, and instantiate the node.
(7) Join node: record the node ID, connect the entry edges and exit edges associated to the node, and instantiate the node.
(8) Final node: record the node ID, connect the entry edges associated to the node, and instantiate the node.

By parsing the different types of nodes and their attributes described above, a data structure corresponding to the UML activity diagram model is constructed in the program memory.

II. Generate Simulation Test Cases Automatically in a Depth-First Strategy in Conjunction with a Hybrid Execution Concept Hybrid execution is an approach that incorporates actual execution and symbolic execution. In actual practice, the two types of execution operations should be carried out for different semantics reflected by the nodes in the activity diagram traversing process. Hereunder the specific treatment manners for different types of nodes will be described:

(1) Initial node: make no treatment, and skip the token in the direction of exit edge to the next activity node.
(2) Action node: the treatment of an action node includes two parts:
a) Carry out actual execution for the statements in the node according to the variable value table, and update the variable value table according to the execution result. In that process, non-input variables may occur, and any new variable is added into the variable value table. The purpose of actual execution is to update variable values in real time and thereby determine the model control flow direction by understanding the execution semantics of the model.
b) At the same time of actual execution of the statements in the node, symbolic execution of the statements is carried out. The symbolic execution process is a process in which an array of coefficients related to the input variables in the variable symbol table. The purpose of symbolic execution is to collect the constraint conditions in the execution path (herein referred to as path conditions) and further generate simulation test cases that can drive the next process of hybrid execution by solving the constraints of the path conditions.
(3) Activity node
In an activity diagram model, an activity node correlates to another activity diagram model. Therefore, once the token is transited to such a node, actually the process has entered into another activity diagram, and, of course, all subsequent operations are similar to recursions.
(4) Decision node: at a decision node, the treatment is made in the following two steps:
a) Determine the specific branch that meets the decision condition by calculation according to the variable value table, and transit the token to the node pointed by the branch.
b) The variable symbol table should be updated during the calculation.
In actual practice, after the above steps are executed, the constraint conditions selected at the node should be pushed into the constraint condition stack for subsequent use.
(5) Merge node: a merge node is a logical successor of a decision node. At a merge node, the token is directly transited into the next activity.
(6) Fork node: a fork node indicates the start of concurrent behaviors. At such a node, the token replicates into a number of copies determined according to the number of exit transition edges of the fork node. Next, the tokens obtained by replication are transited further along the transition edge.
(7) Join node: a join node is a logical successor of a fork node. When a token encounters such a node, the token will wait there, till the tokens on all similar edges are transited to the node and merged into one token, and the resultant token is transited backwards in the direction of the transition edge.
(8) Final node: when encountering a final node, the program can obtain a complete execution path; in that case, all constraint conditions in the path condition stack are read, the stack top constraint is taken out and negated, and then the negated stack top constraint are inputted into a constraint solver together with other constraints in the stack to solve the constraints; in that way, a set of new input variable values can be obtained to drive a new traversing process.

In actual practice, the depth-first traversing strategy is to select the stack top conditions in the path condition stack and negate them sequentially in the condition restraint negation process. If the constraint solving process is failed, relevant path constraints and traversing paths will be saved separately and fed back to the user. Next, the stack top constraint in the constraint condition stack is popped off, the next constraint condition is taken out and negated, and constraint solution is carried out in conjunction with other constraints in the constraint condition stack, to generate new input variable values.

In actual practice, a node coverage value is calculated and updated according to the node access condition; if the node coverage value does not go beyond a node coverage threshold, the token will be returned to the initial node, and is driven with the updated input variable values to transit in the direction of the transition edge, so as to repeat the automatic simulation test case generation process; if the node coverage value is beyond the node coverage threshold, the automatic simulation test case generation process will be terminated, and the process will go to the next step.

III. Simulated Execution of UML Activity Diagram in Generated Simulation Test Cases In actual practice, a set of input variable values are collected through above steps, and these values are used as simulation test cases to carry out simulated execution of the UML activity diagram model. The simulation test cases are saved in the form of key value pairs in an external file, for review by the operator at one hand, and for use in regression testing after model iteration and update on the other hand. In the simulation process, the program reads the simulation test cases from the external file, and each set of test cases can be used to drive a simulated execution of the UML activity diagram model. At the same time of execution, the nodes passed in the activity diagram, the operations executed, and the behaviors invoked, etc., can be observed.

The invention claimed is:

1. A system behavior simulation method based on an activity diagram model, comprising the following steps:
1) reading a Unified Modeling Language (UML) activity diagram model stored in XML Metadata Interchange (XMI) format from a disk file;
2) parsing out various model elements, including initial node, final node, decision node, merge node, fork node, join node, action node, activity node, transition edge, and decision condition, from the UML activity diagram model, respectively, wherein, a transition edge is a directed edge for connecting nodes and indicating a node hopping direction, wherein a decision condition is a condition attached to a transition edge to control a token transition, and wherein a token is flag data that indicates an accessed node;
3) traversing the UML activity diagram model in a hybrid execution approach that incorporates symbolic execution and actual execution, and generating a set of simulation test cases, wherein the symbolic execution is used to express variables as symbols for operating a set of symbolic expressions of input variables as operation result, and accordingly update a symbol value table of the variables, and wherein the actual execution is used to substitute the variables with specific values and execute operations to obtain a set of specific values as the operation result, and accordingly update a specific value table of the variables;
   3.1) initializing a constraint condition stack, a token, variable tables, a node coverage threshold, and a constraint solver, according to the various model elements parsed from the UML activity diagram model, wherein the constraint condition stack is a stack data structure configured to store constraint conditions, wherein the token transition indicates a value change of token flag data, wherein the variable tables include value table and symbol table of variables, wherein a node coverage value is the ratio of the number of accessed nodes to the total number of nodes parsed from the UML activity diagram model, wherein the node coverage value is calculated and updated continuously according to a node access condition while the node coverage threshold is preset, and wherein the constraint solver is configured to solve a set of constraint conditions to obtain specific variable values that meet the set of constraint conditions;
   3.2) generating a set of input variable values randomly to enable the token to be transited in the direction of the transition edge, and treating different types of accessed nodes in different ways, respectively, comprising:
      3.2.1) if the accessed node is an initial node, making no treatment and skipping the token in the direction of an exit edge to a next activity node;
      3.2.2) if the accessed node is an action node, adopting the symbolic execution and the actual execution respectively for statements in the action node according to semantics represented by the action node, and updating the set of input variable values and the node coverage value;
      3.2.3) if the accessed node is an activity node, entering into the UML activity diagram model associated with the activity node, and entering into step 1) to execute another UML activity diagram model simulation process;
      3.2.4) if the accessed node is a decision node, selecting a token transition edge according to the decision condition on the exit edge of the decision node, and pushing the decision condition corresponding to the token transition edge into the constraint condition stack for subsequent use;
      3.2.5) if the accessed node is a merge node, directly transiting the token into the next activity node;
      3.2.6) if the accessed node is a fork node, replicating the token into a specific number of copies determined according to the number of exit edges of the fork node, and transiting backwards tokens obtained by replication along the token transition edge respectively;
      3.2.7) if the accessed node is a join node, observing condition of tokens transited to nodes concurrent with the accessed node, and merging the tokens on all of the concurrent nodes into one token and moving backwards in the direction of the token transition edge if the tokens on all of the concurrent nodes are to be transited to the accessed node;
      3.2.8) if the accessed node is a final node, reading all constraint conditions in the constraint condition stack, taking out the top constraint condition in the constraint condition stack and negating the top constraint condition, and then inputting the negated top constraint condition together with other constraints in the constraint condition stack into the constraint solver to solve constraints, updating the set of input variable values and storing the set of input variable values as the set of simulation test cases if a constraint solution is successful, otherwise saving path conditions that cannot be solved and corresponding traversing paths and having them confirmed manually by an operator, and at the same time, popping off the constraint condition stack top element in the constraint condition stack, taking out the next constraint condition in the constraint condition stack and negating the next constraint condition, and then inputting the negated next constraint condition together with other constraints in the constraint condition stack into the constraint solver to solve the constraints, and updating the set of input variable values; and
      3.2.9) calculating and updating the node coverage value according to the node access condition, returning the token to the initial node, transiting the token in the direction of the transition edge with the set of input variable values updated in step 3.2.8), and entering into step 3.2.1) if the node coverage value goes beyond the node coverage threshold, otherwise entering into step 4); and 4) inputting the set of simulation test cases generated in step 3) to carry out a simulated execution of the UML activity diagram model.

* * * * *